(12) United States Patent
Bang et al.

(10) Patent No.: US 9,893,203 B2
(45) Date of Patent: Feb. 13, 2018

(54) THIN FILM TRANSISTOR ARRAY PANEL AND METHOD FOR MANUFACTURING THE SAME

(71) Applicant: Samsung Display Co., Ltd., Yongin-si (KR)

(72) Inventors: Seok Hwan Bang, Yongin-si (KR); Sook-Hwan Ban, Asan-si (KR); Hyung Jun Kim, Yongin-si (KR); Woo Geun Lee, Yongin-si (KR); Hyeon Jun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/246,366

(22) Filed: Aug. 24, 2016

(65) Prior Publication Data

US 2017/0110591 A1    Apr. 20, 2017

(30) Foreign Application Priority Data

Oct. 16, 2015  (KR) .......................... 10-2015-0144680

(51) Int. Cl.
| | | |
|---|---|---|
| H01L 29/786 | (2006.01) | |
| H01L 27/12 | (2006.01) | |
| H01L 27/32 | (2006.01) | |
| G02F 1/1368 | (2006.01) | |
| G02F 1/1362 | (2006.01) | |

(52) U.S. Cl.
CPC ........ *H01L 29/7869* (2013.01); *H01L 27/124* (2013.01); *H01L 27/1214* (2013.01);
(Continued)

(58) Field of Classification Search
CPC ........... H01L 27/11266; H01L 27/1214; H01L 27/1251; H01L 27/3248; H01L 27/3276;
(Continued)

(56) References Cited

U.S. PATENT DOCUMENTS 5,851,440 A * 12/1998 Tanaka ................ G02F 1/13454
257/347
6,087,730 A * 7/2000 McGarvey .......... H01L 27/1214
257/751

(Continued)

FOREIGN PATENT DOCUMENTS

| JP | 2013-236101 | 11/2013 |
|---|---|---|
| JP | 2014/032999 | 2/2014 |
| KR | 10-2002-0089758 | 11/2002 |
| KR | 10-1274684 | 6/2013 |

*Primary Examiner* — Eduardo A Rodela
(74) *Attorney, Agent, or Firm* — H.C. Park & Associates, PLC

(57) ABSTRACT

One or more exemplary embodiments disclose a thin film transistor array panel and a manufacturing method thereof including a substrate, a gate line on the substrate, the gate line including a gate electrode, a gate insulating layer on the gate electrode, a semiconductor layer on the gate insulating layer, and the semiconductor layer including an oxide semiconductor, a data wire layer above the semiconductor layer, the data wire layer including a data line, a source electrode coupled to the data line, and a drain electrode facing the source electrode, and a metal phosphorus oxide layer configured to cover the source electrode and the drain electrode.

19 Claims, 13 Drawing Sheets

(52) U.S. Cl.
CPC ...... *H01L 27/1225* (2013.01); *H01L 27/1262* (2013.01); *H01L 27/3248* (2013.01); *H01L 27/3276* (2013.01); *H01L 29/786* (2013.01); *H01L 29/78618* (2013.01); *H01L 29/78696* (2013.01); *G02F 1/1368* (2013.01); *G02F 1/136286* (2013.01)

(58) Field of Classification Search
CPC . H01L 29/786; H01L 27/78618; H01L 21/24; H01L 21/28105; H01L 21/4916; H01L 27/7869
See application file for complete search history.

(56) References Cited

U.S. PATENT DOCUMENTS

| | | | |
|---|---|---|---|
| 7,511,300 B2 | 3/2009 | Lee et al. | |
| 7,785,947 B2 | 8/2010 | Isobe et al. | |
| 8,710,497 B2* | 4/2014 | Kim | H01L 29/7869 257/43 |
| 2008/0258141 A1* | 10/2008 | Park | H01L 29/78618 257/43 |
| 2013/0329176 A1* | 12/2013 | Kuniyoshi | G02F 1/1368 349/138 |
| 2015/0115264 A1 | 4/2015 | Kato | |
| 2016/0133348 A1* | 5/2016 | Kang | H01B 1/026 257/99 |
| 2016/0211177 A1* | 7/2016 | Suzumura | H01L 21/76895 |

\* cited by examiner

THIN FILM TRANSISTOR ARRAY PANEL AND METHOD FOR MANUFACTURING THE SAME

CROSS-REFERENCE TO RELATED APPLICATION

This application claims priority from and the benefit of Korean Patent Application No. 10-2015-0144680, filed on Oct. 16, 2015, which is hereby incorporated by reference for all purposes as if fully set forth herein.

BACKGROUND

Field

The present invention relates to a thin film transistor array panel and a manufacturing method thereof.

Discussion of the Background

Generally, a display device, such as a liquid crystal display, an organic light emitting diode display, or the like includes a plurality of pairs of electric field generating electrodes and electro-optical active layers interposed therebetween. The liquid crystal display may include a liquid crystal layer as the electro-optical active layer, and the organic light emitting diode display may include an organic emission layer as the electro-optical active layer.

One of the pair of electric field generating electrodes is connected to a switching element and receives an electrical signal, and the electro-optical active layer serves to convert the electrical signal to an optical signal, thereby displaying an image.

A thin film transistor (TFT), which is a three-terminal device, is adopted as the switching element in the display device, and a signal line including a gate line for transferring a scanning signal for controlling the thin film transistor, a data line for transferring a signal applied to a pixel electrode, and the like is included in the display device.

Meanwhile, as the display area becoming larger, an oxide semiconductor technique for faster operating speed and reduction of the signal line resistance have been researched. For example, a main wiring layer may be formed of a material such as copper, its alloy, or the like for reducing the signal line resistance. Copper, however, may form a porous metal oxide between the main wiring layer and a passivation layer covering thereon, thereby deteriorating reliability of the device.

The above information disclosed in this Background section is only for enhancement of understanding of the background of the inventive concept, and, therefore, it may contain information that does not form the prior art that is already known in this country to a person of ordinary skill in the art.

SUMMARY

The present invention has been made in an effort to provide a thin film transistor array panel and a manufacturing method thereof, having advantages of preventing a porous metal oxide from being formed between a main wiring layer and a passivation layer.

Additional aspects will be set forth in the detailed description which follows, and, in part, will be apparent from the disclosure, or may be learned by practice of the inventive concept.

According to one or more exemplary embodiments, a thin film transistor array panel includes a substrate, a gate line on the substrate, the gate line including a gate electrode, a gate insulating layer on the gate electrode, a semiconductor layer on the gate insulating layer, and the semiconductor layer including an oxide semiconductor, a data wire layer above the semiconductor layer, the data wire layer including a data line, a source electrode coupled to the data line, and a drain electrode facing the source electrode, and a metal phosphorus oxide layer configured to cover the source electrode and the drain electrode.

A channel region of the semiconductor layer may include phosphorus (P).

The metal phosphorus oxide layer may include phosphorus, oxygen, and at least one selected from a group consisting of a copper-based metal, an aluminum-based metal, a silver-based metal, a molybdenum-based metal, and a titanium-based metal.

The metal phosphorus oxide layer may cover an upper surface and a lateral surface of each of the source electrode and the drain electrode.

The thin film transistor array panel may further include a barrier layer interposed between the data wire layer and the semiconductor layer.

Each of the data wire layer and the barrier layer may be configured to expose a channel region of the semiconductor layer to upper layer.

A region of the barrier layer exposing the channel region of the semiconductor layer may be narrower than a region of the data wire layer exposing the channel region of the semiconductor layer.

The thin film transistor array panel may further include a passivation layer configured to cover the metal phosphorus oxide layer, the source electrode, the drain electrode.

The passivation layer may include a silicon oxide.

The semiconductor layer may accord with an edge lateral surface of the source electrode, the drain electrode, and the data line except for the channel region.

Lateral edge portions of the semiconductor layer, the data line, and the drain electrode and lateral portions of the source electrode and the drain electrode exposing a channel region of the semiconductor layer may include lateral surfaces that are inclined at an angle of from about 10° to about 80° with respect to the substrate.

According to one or more exemplary embodiments, a manufacturing method of a thin film transistor array panel includes forming a gate line including a gate electrode on a substrate, forming a semiconductor layer on the substrate, forming a data wire layer including a data line intersecting the gate line, a source electrode connected to the data line and placed above the semiconductor layer, and a drain electrode placed above the semiconductor layer and facing the source electrode, performing a phosphine treatment on the data wire layer, and forming a passivation layer on the data wire layer, wherein the forming of the passivation layer includes forming a metal phosphorus oxide layer covering the source electrode and the drain.

The phosphine treatment on the data wire layer may be performed as a heat treatment or a plasma treatment.

The metal phosphorus oxide layer may be formed to cover an upper surface and a lateral surface of each of the source electrode and the drain electrode.

The passivation layer may include a silicon oxide.

The manufacturing method may further include forming a barrier layer configured to expose a channel region of the semiconductor layer after forming of the semiconductor layer.

A region of the barrier layer exposing the channel region of the semiconductor layer may be formed narrower than the data wire layer, exposing the channel region of the semiconductor layer.

Lateral edge portions of the semiconductor layer, the data line, and the drain electrode and lateral portions of the source electrode and the drain electrode exposing a channel region of the semiconductor layer may include lateral surfaces that are inclined at an angle of from about 10° to about 80° with respect to the substrate.

According to one or more exemplary embodiments, a thin film transistor array panel includes a substrate, a semiconductor layer above the substrate, and the semiconductor layer including an oxide semiconductor, first and second data wire layers above the semiconductor layer, the first and second data wire layers facing each other, and a metal phosphorus oxide layer covering the first and second data wire layer from an upper layer.

The upper layer may be on both of the metal phosphorus oxide layer and the semiconductor layer.

The thin film transistor array panel may further include a first barrier layer between the semiconductor layer and the first wire layer, and a second barrier layer between the semiconductor layer and the second wire layer. A distance between the first and second barrier layers on a channel region of the semiconductor layer is narrower than a distance between the first and second data wire layers on the channel region of the semiconductor layer.

According to the exemplary embodiment of the present invention, it is possible to improve reliability of the thin film transistor array panel.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
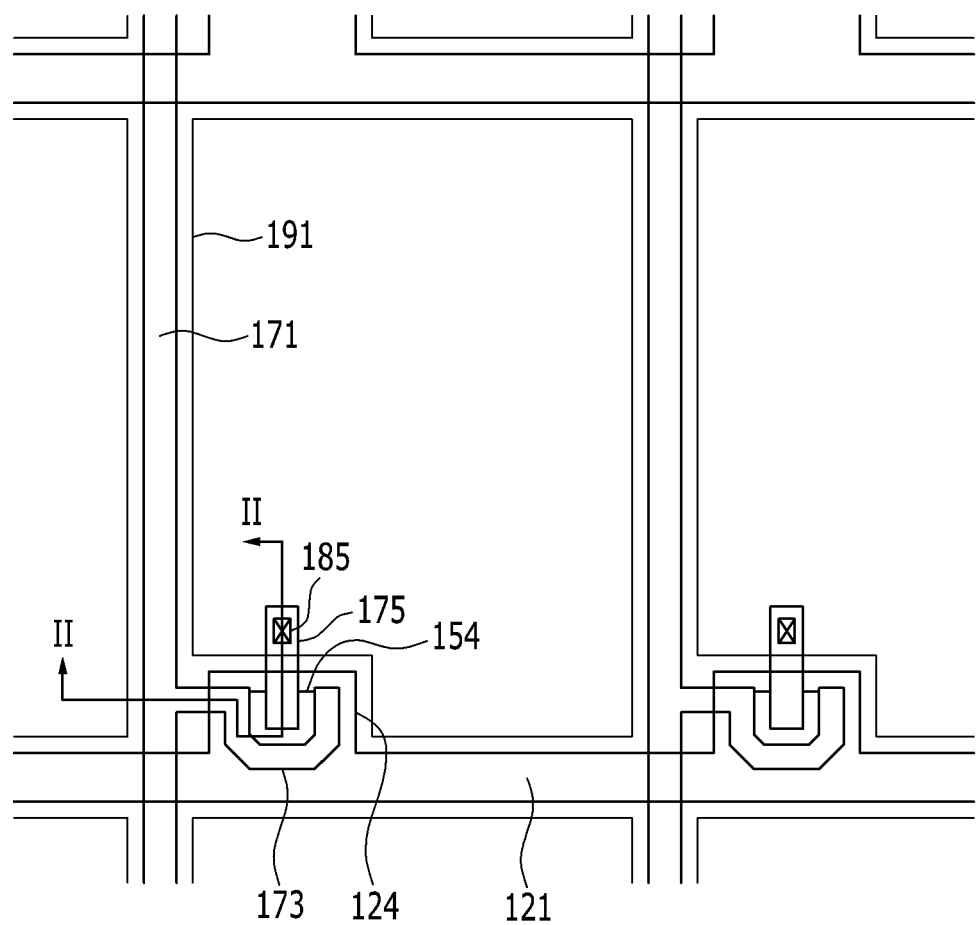
FIG. 1 is a top plan view illustrating a thin film transistor array panel according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
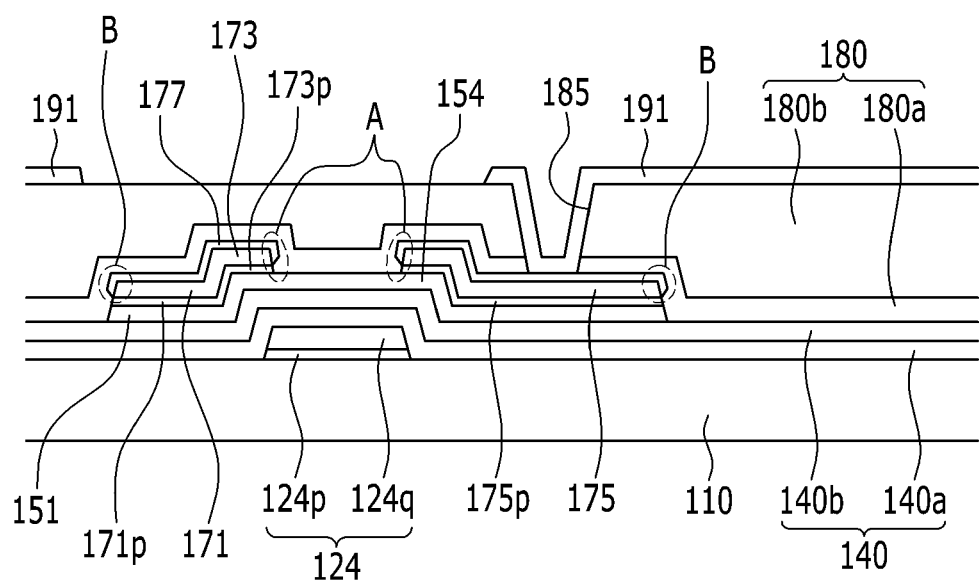
FIG. 2 is a cross-sectional view taken along line II-II of FIG. 1.

FIG. 1 is a top plan view illustrating a thin film transistor array panel according to one or more exemplary embodiments. FIG. 2 is a cross-sectional view taken along line II-II of FIG. 1.

Referring to FIG. 1 and FIG. 2, the thin film transistor array panel 100 may include a gate line 121 disposed on an insulation substrate 110 made of a material such as transparent glass, plastic, or the like.

Each gate line 121 may be substantially extended in a horizontal direction. The gate line 121 may serve to transmit a gate signal and substantially. The gate line 121 includes a plurality of gate electrodes protruded therefrom.

Each gate electrode 124 may be configured to have a dual-layer structure including a first layer 124p and a second layer 124q. The first layer 124p and the second layer 124q may be formed of an aluminum-based metal such as aluminum (Al), an aluminum alloy, or the like, a silver-based metal such as silver (Ag), a silver alloy, or the like, a copper-based metal such as copper (Cu), a copper alloy, or the like, a molybdenum-based metal such as molybdenum (Mo), a molybdenum alloy, or the like, chromium (Cr), titanium (Ti), tantalum (Ta), manganese (Mn), or the like. For example, the first layer 124p may include titanium, and the second layer 124q may include copper or a copper alloy. In one or more exemplary embodiments, the first layer 124p and the second layer 124q may be formed by combining layers having different physical properties. It is contemplated that the gate electrode 124 may include dual-layers as described with reference to FIG. 1, but embodiments are not limited thereto. The gate electrode 124 may include a single-layers or triple-layers.

In one or more exemplary embodiments, the gate line 121 may include multi-layers similar to the gate electrode 124, because both of them are formed in the same process. For instance, the gate line 121 may include third and fourth layers corresponding to, and maybe the same as, the first and second layers 124p and 124q, respectively.

A gate insulating layer 140 made of an insulating material such as a silicon oxide or a silicon nitride is disposed on the gate line 121. The gate insulating layer 140 may include a first insulating layer 140a and a second insulating layer 140b. In one exemplary embodiment, the first insulating layer 140a may be formed of a silicon nitride (SiNx) up to about 4000 Å thick, and the second insulating layer 140b may be made of a silicon oxide (SiOx) up to about 500 Å thick. In another exemplary embodiment, the first insulating layer 140a may be made of a silicon oxynitride (SiON), and the second insulating layer 140b may be made of a silicon oxide (SiOx). In one or more exemplary embodiments, the gate insulating layer 140 may be configured to be the single layer or the like.

A semiconductor layer 151 is disposed on the gate insulating layer 140. The semiconductor layers 151 may be formed of amorphous silicon, crystalline silicon, or an oxide semiconductor. The semiconductor layer 151 includes a projection 154 over the gate electrodes 124.

In one or more embodiments, the semiconductor layer 151 may be made of the oxide semiconductor. In this manner, the semiconductor layer 151 may include at least one of zinc (Zn), indium (In), tin (Sn), gallium (Ga), and hafnium (Hf). For example, the semiconductor layer 151 may be formed of indium-gallium-zinc oxide.

Data wire layers 171, 173, and 175 including a data line 171, a source electrode 173 connected to the data line 171, and a drain electrode 175 are disposed on at least one of the semiconductor layer 151 and the gate insulating layer 140.

Each data line 171 may substantially extends in the vertical direction and intersects with the gate line 121. Each source electrode 173 extends from the data line 171 and overlaps the gate electrodes 124. In one or more exemplary embodiments, the source electrode 173 may have a substantially U-shape.

The drain electrode 175 may be separated from the data line 171. In one or more exemplary embodiments, the drain electrode 175 may extend toward the center of the U-shape of the source electrode 173.

The data wire layers 171, 173, and 175 may have a region exposing a channel region of the semiconductor layer 151. The data wire layers 171, 173, and 175 may be formed of at least one metal selected from a copper-based metal, an aluminum-based metal, a silver-based metal, a molybdenum-based metal, and a titanium-based metal.

Barrier layers 171p, 173p, and 175p may be interposed between the data wire layers 171, 173, and 175, and the semiconductor layer 151. The barrier layers 171p, 173p, and 175p may be formed of a metal oxide such as an indium-zinc oxide, a gallium-zinc oxide, an aluminum-zinc oxide, a titanium oxide, an aluminum oxide, a molybdenum oxide, or the like. The barrier layers 171p, 173p, and 175p serve as diffusion preventing layers preventing a material such as copper or the like from being diffused into the semiconductor layer 151.

A metal phosphorus oxide layer 177 is disposed on the data wire layers 171, 173, and 175. The metal phosphorus oxide layer 177 may include phosphorus, oxygen, and at least one selected from a copper-based metal, an aluminum-based metal, a silver-based metal, a molybdenum-based metal, and a titanium-based metal. For example, the metal phosphorus oxide layer 177 may include a compound indicated by $Cu_xP_yO_z$. In one or more exemplary embodiments, the metal phosphorus oxide layer 177 is configured to cover the source electrode 173 and the drain electrode 175. In one or more exemplary embodiments, the metal phosphorus oxide layer 177 may cover lateral surfaces A and B of the source electrode 173 and the drain electrode 175, and upper surfaces of the source electrode 173 and the drain electrode 175. The metal phosphorus oxide layer 177 may directly contact the surfaces of the source electrode 173 and the drain electrode 175. The metal phosphorus oxide layer 177 may not be formed on a part of the gate insulating layer 140 and the channel region of the semiconductor layer 151, which do not overlap the source electrode 173 and the drain electrode 175.

Hereinafter, the lateral portions A of the source electrode 173 and the drain electrode 175 adjacent to the channel region of the semiconductor layer 151 will be described in detail.

The projection 154 of the semiconductor layer 151 includes an exposed part between the source electrode 173 and the drain electrode 175. The semiconductor layer 151 may be configured to have a substantially identical planar pattern to those of the data line 171 and the drain electrode 175 except for the exposed part of the projection 154. In other words, lateral edges of the semiconductor layer 151 may substantially coincide with the lateral edges of the data line 171 and the drain electrode 175 except for the exposed part of the projection 154.

In this manner, lateral edges of the semiconductor layer 151, the data line 171, and the drain electrode 175 and the lateral portions A of the source electrode 173 and the drain electrode 175 may include an inclined lateral surface having a predetermined angle with respect to the insulation substrate 110. For instance, the lateral edges of the semiconductor layer 151, the data line 171, and the drain electrode 175 and the lateral portions A of the source electrode 173 and the drain electrode 175, which are configured to expose the channel region of the semiconductor layer 151, may include lateral surfaces that are inclined at an angle of from about 10° to about 80° with respect to the insulation substrate 110.

The gate electrode 124, the source electrode 173, and the drain electrode 175 constitute one thin film transistor (TFT) together with the projection 154 of one semiconductor layer 151, and a channel region of the thin film transistor is formed in the projection 154 between the source electrode 173 and the drain electrode 175.

In one or more exemplary embodiments, the source electrode 173 and the drain electrode 175 are covered with the metal phosphorus oxide layer 177 made of the material such as copper and the like.

It is assumed that the lateral portions A of the source electrode 173 and the drain electrode 175 are exposed without being covered with the metal phosphorus oxide layer 177. In a following process for forming a passivation layer 180 including a silicon oxide, the material such as copper and the like included in the data wire layers 171, 173, and 175 may form a porous oxide, thereby deteriorating a thin film transistor characteristic. When heat-treating the projection 154 of the semiconductor layer 151 for suitable channel characteristics, the data wire layers 171, 173, and 175 may form a porous oxide.

In one or more embodiments, the metal phosphorus oxide layer 177 may be provided to cover the lateral portions A of the source electrode 173 and the drain electrode 175. This may prevent the data wire layers 171, 173, and 175 from oxidation.

In the present exemplary embodiment, the metal phosphorus oxide layer 177 may be formed by heat or by plasma.

A passivation layer 180 is disposed on the metal phosphorus oxide layer 177 and the projection 154. The passivation layer 180 may further cover the gate insulating layer 140. In one or more exemplary embodiments, the passivation layer 180 is made of an inorganic insulator such as a silicon nitride, a silicon oxide, or the like, or an organic insulator, a low dielectric constant insulator, or the like.

In one or more exemplary embodiments, the passivation layer 180 may include a lower passivation layer 180a and an upper passivation layer 180b. For example, the lower passivation layer 180a may be formed of a silicon oxide, and the upper passivation layer 180b may be formed of a silicon nitride when the semiconductor layer 151 includes the oxide semiconductor.

The passivation layer 180 may contact an exposed part of the semiconductor layer between the source electrode 173 and the drain electrode 175.

A contact hole 185 may be formed in the passivation layer 180 to expose one end of the drain electrode 175. A pixel electrode 191 formed on the passivation layer 180 may be electrically coupled to the drain electrode 175 through the contact hole 185 and serve to receive data voltages from the drain electrode 175. In one or more exemplary embodiments, the pixel electrode 191 may be formed of a transparent conductor such as ITO, IZO, or the like.

FIG. 3 through FIG. 10 are the cross-sectional views illustrating a manufacturing method of a thin film transistor array panel according to one or more exemplary embodiments. Each of FIG. 3 through FIG. 10 is a cross-sectional views taken along line II-II of FIG. 1.

Figure 3:
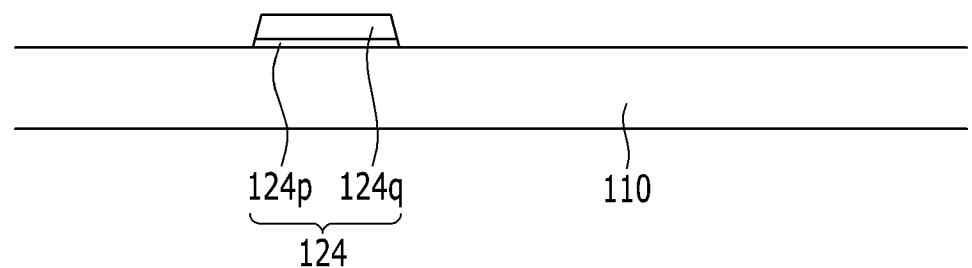
FIGS. 3 through 10 are cross-sectional views illustrating a manufacturing method of a thin film transistor array panel according to one or more exemplary embodiments.

Referring to FIG. 3, a double layer is formed by stacking at least one of a molybdenum-based metal such as molybdenum (Mo), a molybdenum alloy, or the like, chromium (Cr), a chromium alloy, titanium (Ti), a titanium alloy, tantalum (Ta), a tantalum alloy, manganese (Mn), and a manganese alloy on the substrate 110 made of, for example, transparent glass, plastic, or the like, and then stacking thereon one selected from an aluminum-based metal such as aluminum (Al), an aluminum alloy, and the like, a silver-based metal such as silver (Ag), a silver alloy, and the like, and a copper-based metal such as copper (Cu), a copper alloy, and the like. Then, the double layer is patterned, to form the gate line 121 including the gate electrode 124 shown in FIG. 1. For example, the lower layer 124p may include titanium and the upper layer 124q may include copper or a copper alloy.

In one or more exemplary embodiments, after the double layer is formed, a photosensitive film (not illustrated) is stacked and patterned, and then the lower layer 124p and the upper layer 124q are etched together by using a photosensitive film pattern (not illustrated) as a mask. Herein, the etchant used may etch the lower layer 124p and the upper layer 124q all together.

Figure 4:
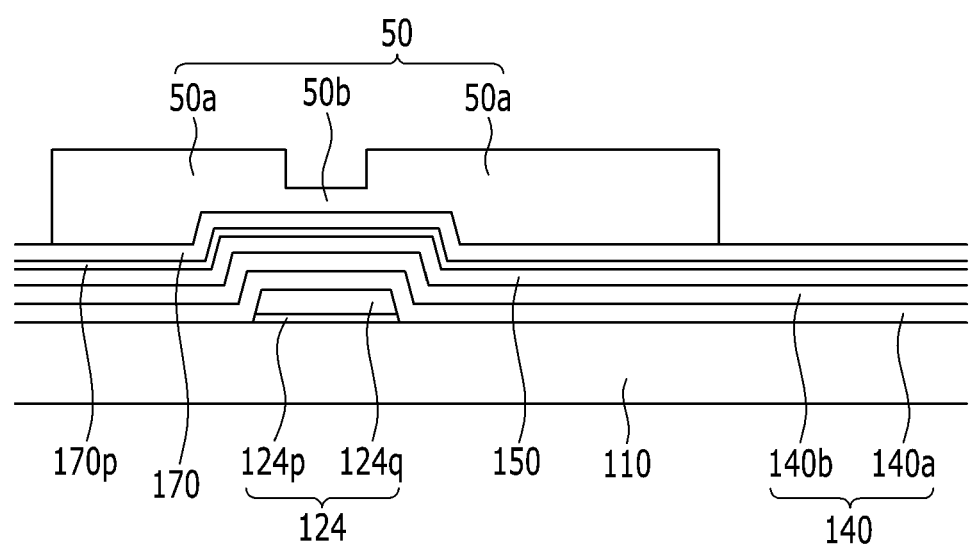

Referring to FIG. 4, the gate insulating layer 140, an oxide semiconductor layer 150, a metal oxide layer 170p, and a metal layer 170 are stacked on the gate electrode 124. The gate insulating layer 140 may be formed by depositing the first insulating layer 140a including a silicon nitride and then depositing the second insulating layer 140b including a silicon oxide.

In one or more exemplary embodiments, the oxide semiconductor layer 150 may include at least one of zinc (Zn), indium (In), tin (Sn), gallium (Ga), and hafnium (Hf). In one or more exemplary embodiments, the oxide semiconductor layer 150 may be substituted by one of amorphous silicon, crystalline silicon, and the like. The metal oxide layer 170p may include any one of indium-zinc oxide, gallium-zinc oxide, and aluminum-zinc oxide, and the metal layer 170 may include copper or a copper alloy.

Then, after forming a photoresist layer, a first photosensitive film pattern 50 is patterned. The first photosensitive film pattern 50 includes a first region 50a formed to be relatively thick and a second region 50b formed to be relatively thin. A thickness difference of the first photosensitive film pattern 50 may be formed by a reflow method or by adjusting light radiation amount using a mask. In order to adjust the light radiation amount, a mask having a slit pattern, a lattice pattern, or a translucent layer thereon may be used. The second region 50b having a thin thickness is configured to correspond to a position where a channel region of the thin film transistor is to be formed.

Figure 5:
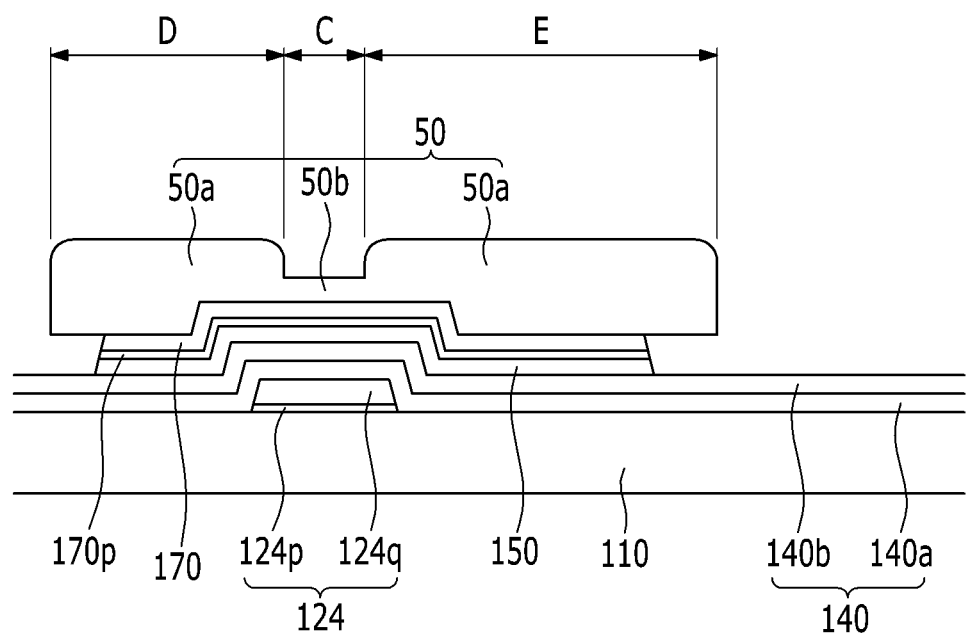

Referring to FIG. 5, the metal oxide layer 170p and the metal layer 170 are etched by using an etchant for etching the metal oxide layer 170p and the metal layer 170 together with the first photosensitive film pattern 50 as a mask. Herein, the etchant may be identical to the etchant employed in etching the lower layer 124p and the upper layer 124q of the gate electrodes 124.

Lateral surfaces of the metal oxide layer 170p and the metal layer 170 covered with the first photosensitive film pattern 50 may be etched by the etchant. As a result, as shown in FIG. 5, an edge (corresponding to a lateral portion C) of a data conductor layer, which is the metal layer 170, is disposed at inner sides of regions C, D, and E in which the first photosensitive film pattern 50 is formed. In this manner, the etchant etching the metal oxide layer 170p and the metal layer 170 does not etch the gate insulating layer 140 or the oxide semiconductor layer 150.

Further, the oxide semiconductor layer 150 is etched by using the first photosensitive film pattern 50 as a mask. In this manner, an edge of the oxide semiconductor layer 150 may be placed within the regions C, D, and E as shown in FIG. 5.

Figure 6:
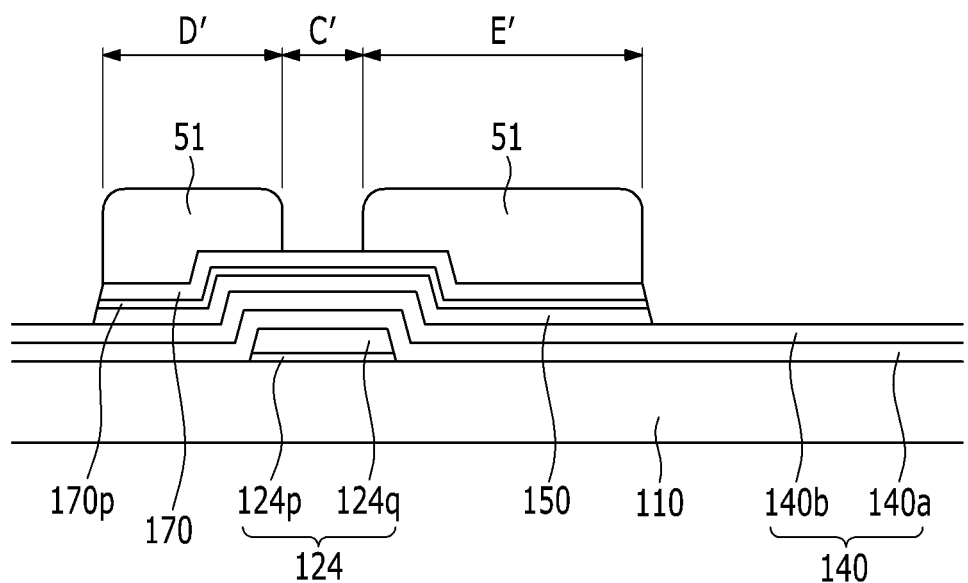

Referring to FIG. 6, the second region 50b having the thin thickness shown in FIG. 5 is removed by an etch-back process. Herein, the first region 50a is jointly etched therewith to reduce a width and a height thereof, and becomes a second photosensitive film pattern 51. The second photosensitive film pattern 51 is formed at regions C', D', and E' that are narrower than the regions C, D, and E of FIG. 5.

Figure 7:
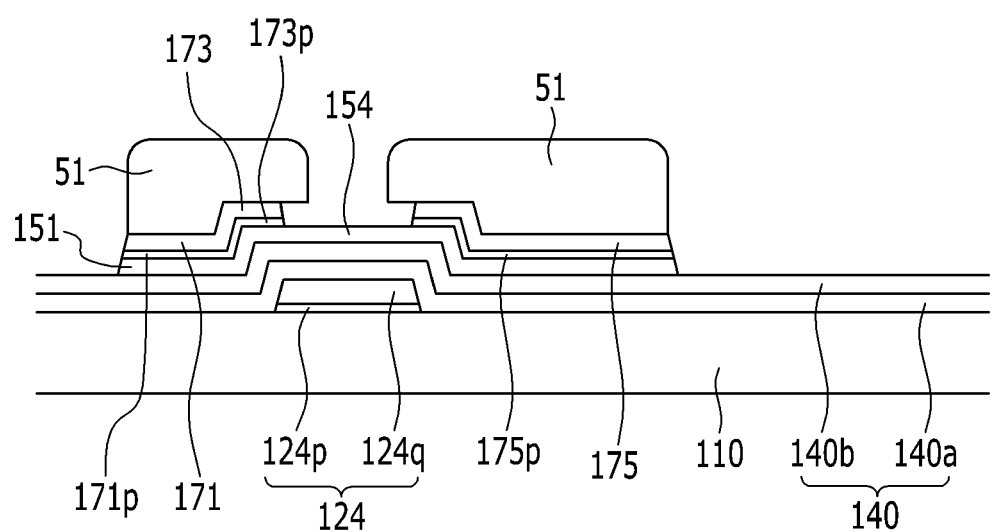

Referring to FIG. 7, the metal oxide layer 170p and the metal layer 170 are wet etched by using the etchant and the second photosensitive film pattern 51 as mask. Herein, the metal layer 170 is divided to form the data line 171, the source electrode 173, and the drain electrode 175, and the metal oxide layer 170p is divided to form the barrier layers 171p, 173p, and 175p. Further, an upper surface of the oxide semiconductor layer 150 shown in FIG. 6 is exposed to form the semiconductor layer 151 including the projection 154 forming a channel of the thin film transistor.

As such, the semiconductor layer 151 and the projection 154 having substantially identical planar patterns to those of the barrier layers 171p, 173p, and 175p of the data line 171, the source electrode 173, and the drain electrode 175 and the data wire layers 171, 173, and 175 are formed by using photosensitive film patterns having different thicknesses. Specifically, planar patterns of the semiconductor layer 151 and the projection 154 are substantially identical to planar patterns of the data line 171, the source electrode 173, and the drain electrode 175 except for the exposed part between the drain electrode 175 and the source electrode 173.

Figure 8:
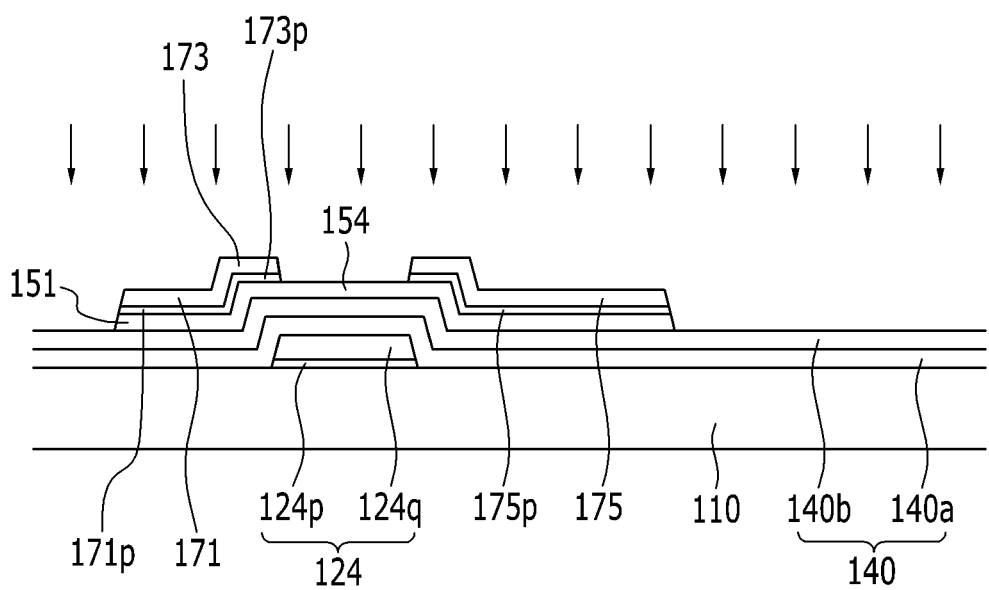

Next, referring to FIG. 8, a phosphine (PH$_3$) treatment may be performed to form the metal phosphorus oxide layer 177 on surfaces of the source electrode 173 and the drain electrode 175 after the photosensitive film pattern is removed by ashing. The phosphine (PH$_3$) treatment may be done by heat treatment or by plasma. In one or more exemplary embodiments, the phosphine (PH$_3$) treatment is performed on an entire surface of the thin film transistor array panel to form a phosphide material layer 176 along the surfaces of the source electrode 173 and the drain electrode 175.

Figure 9:
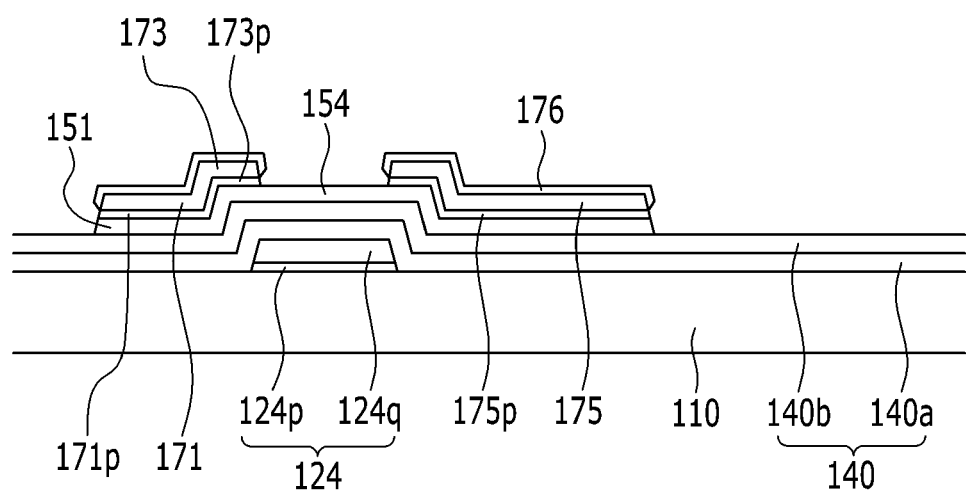

Referring to FIG. 9, the phosphide material layer 176 is formed to cover the lateral surfaces of the source electrode 173 and the drain electrode 175 exposing the channel region.

Meanwhile, the channel region of the semiconductor layer 154 may be doped with phosphorus (P) by performing the phosphine treatment on the channel region of the semiconductor layer 154. Herein, the phosphorus (P) may serve as a donor to form a conductive layer, reducing defects of the channel region of the semiconductor layer 154 and improving electrical conductivity may be lowered. This enhances a device characteristic of the thin film transistor array panel.

Figure 10:
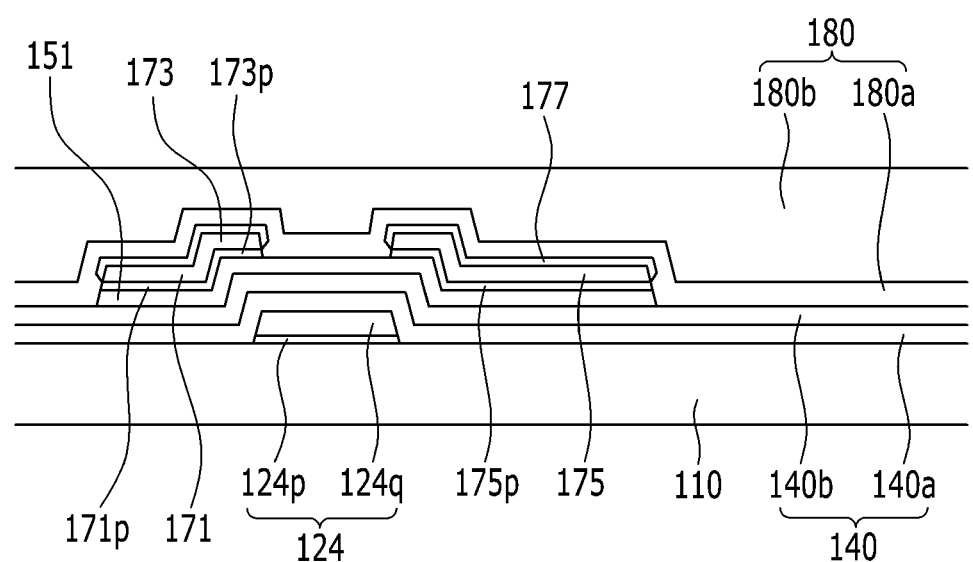

Referring to FIG. 10, the passivation layer 180 is disposed on the phosphide material layer 176. The passivation layer 180 may be formed to include the lower passivation layer 180a including a silicon oxide (SiOx) on the phosphide material layer 176 and the upper passivation layer 180b including silicon nitride (SiNx) on the lower passivation layer 180a. A nitrogen oxide, e.g., nitrous oxide (N$_2$O), may be treated in a process of forming the lower passivation layer 180a including a silicon oxide (SiOx), and the phosphide material layer 176 and nitrogen oxide react with each other, forming the metal phosphorus oxide layer 177. The metal phosphorus oxide layer 177 may be a final form of the phosphide material layer 176.

The thin film transistor array panel in FIG. 2 may be formed by forming a contact hole 185 exposing a part of the drain electrode 175 by patterning the passivation layer 180, and by forming the pixel electrode 191 on the passivation layer 180. Herein, the pixel electrode 191 is formed to be physically connected to the drain electrode 175 through the contact holes 185.

Hereinabove, it has been described that the thin film transistor array panel is configured to have a bottom gate structure that has a gate electrode disposed at a lower portion thereof, but embodiments are not limited thereto. For example, the thin film transistor array panel may adopt a top gate structure in which the gate electrode is disposed at an upper portion thereof.

Figure 11:
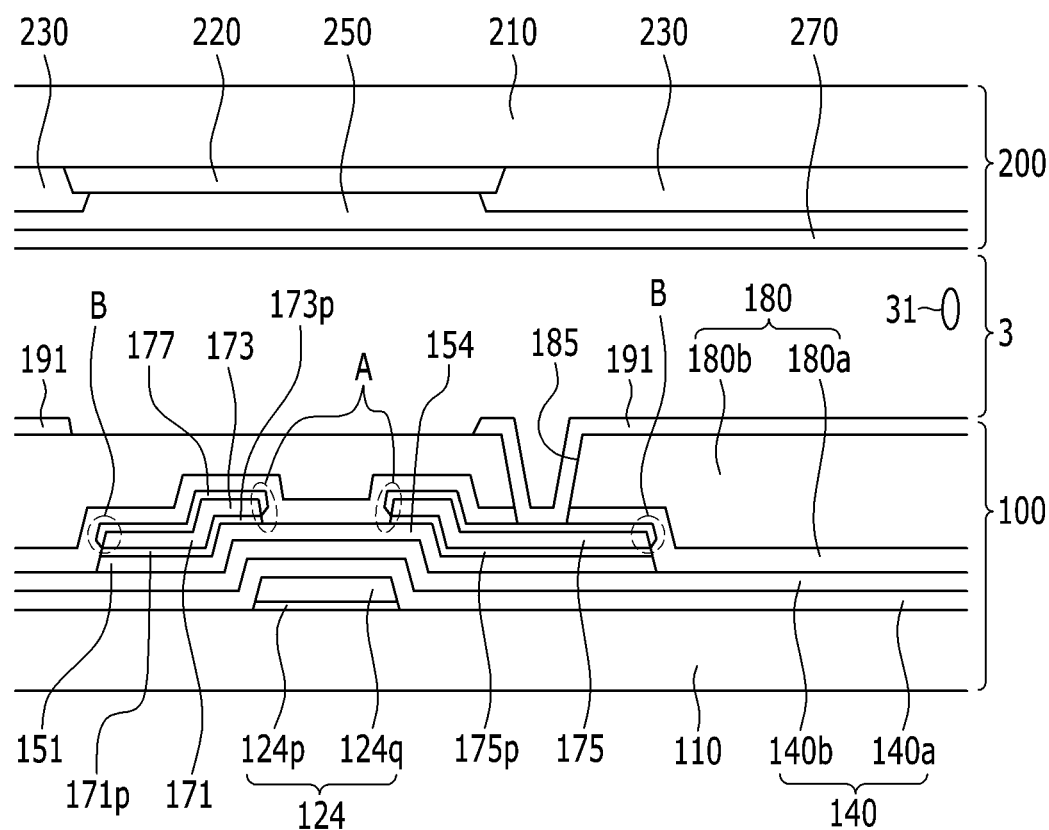
FIG. 11 is a cross-sectional view illustrating a liquid crystal display according to one or more exemplary embodiments.

FIG. 11 is a cross-sectional view illustrating a liquid crystal display according to one or more exemplary embodiments.

Referring to FIG. 11, a second substrate 210 is disposed in such a position so as to face a first substrate 110. The second substrate 210 may be an insulation substrate made of transparent glass, plastic, or the like. A light blocking member 220 is formed on the second substrate 210. The light blocking member 220 is also called a black matrix and serves to prevent light leakage.

A plurality of color filters 230 are also disposed on the second substrate 210 and the light blocking member 220. The color filters 230 are substantially disposed within a region surrounded by the light blocking member 220, and may extend along the pixel electrode 191. Each color filter 230 may display one of three primary colors such as red, green, and blue. However, embodiments are not limited thereto. For example, each color filter 230 may display one of cyan, magenta, yellow, and white series.

The light blocking member 220 and the color filters 230 have been described above as being formed in a facing display panel 200; however, aspects of the light blocking member 220 and the color filters 230 are not limited thereto.

For example, at least one of the light blocking member 220 and the color filters 230 may be disposed on the thin film transistor array panel 100.

An overcoat 250 is disposed on the color filters 230 and the light blocking member 220. The overcoat 250 may be made of an insulating material and serves to prevent the color filters 230 from being exposed and provide a flat surface. The overcoat 250 may be omitted.

A common electrode 270 is disposed on the overcoat 250.

The pixel electrode 191 applied with a data voltage and the common electrode 270 applied with a common voltage generate an electric field, thereby determining a direction of liquid crystal molecules 31 of a liquid crystal layer 3 interposed therebetween. The pixel electrode 191 and the common electrode 270 constitute a capacitor and maintain an applied voltage even after the thin film transistor is turned off.

The pixel electrode 191 may constitute a storage capacitor by overlapping a storage electrode line (not illustrated), thereby enhancing a voltage-maintaining capacity.

The exemplary embodiment described with reference to FIG. 2 may be applied to the thin film transistor array panel 100.

Herein, it has been described that the thin film transistor array panel is applied to the liquid crystal display; however, embodiments are not limited thereto. One or more exemplary embodiments may be widely applied to a display device performing a switching operation by using an organic light emitting diode device or other thin film transistors.

Figure 12:
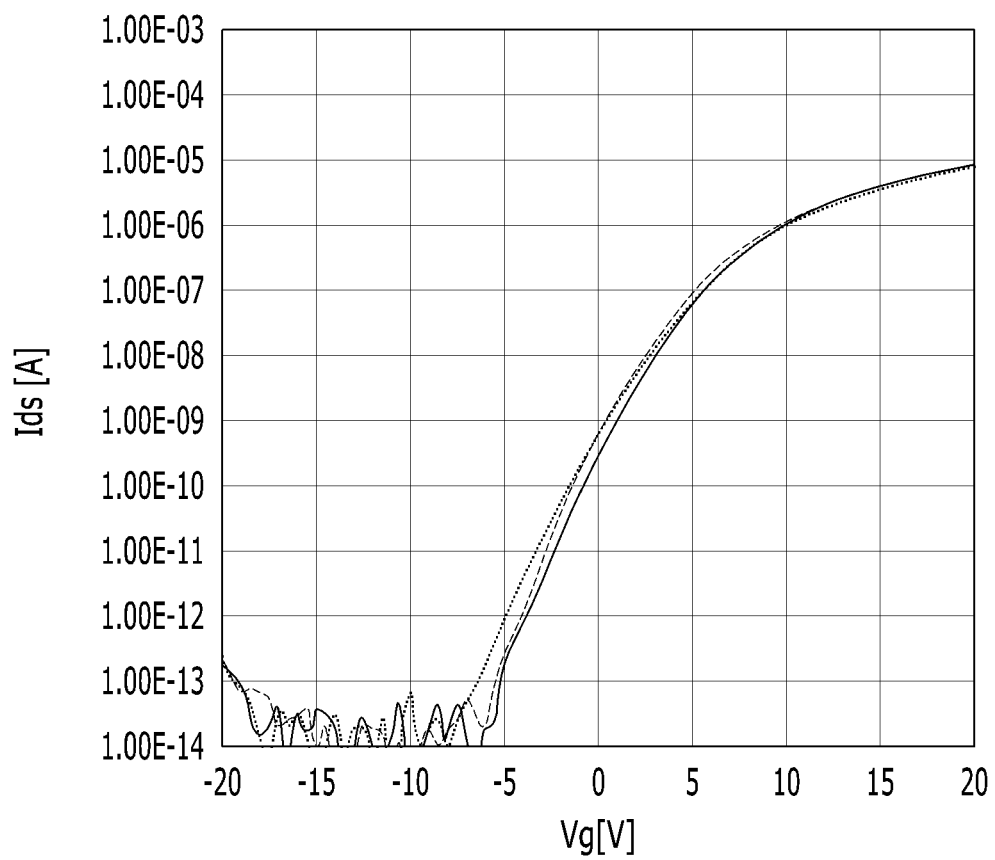
FIG. 12 is a graph illustrating an on-current characteristic depending on a gate voltage of a thin film transistor according to a comparative embodiment.
Figure 13:
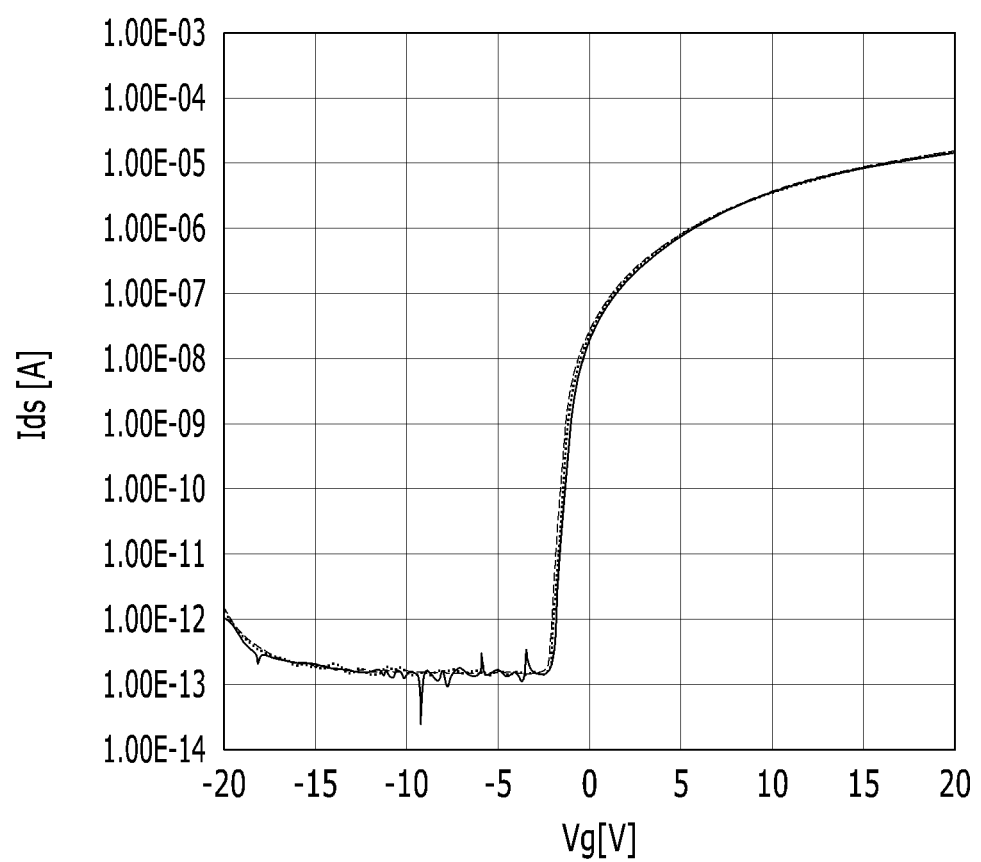
FIG. 13 is a graph illustrating an on-current characteristic depending on a gate voltage of a thin film transistor according to an exemplary embodiment.

FIG. 12 is a graph illustrating an on-current characteristic depending on a gate voltage of a thin film transistor according to a comparative embodiment, and FIG. 13 is a graph illustrating an on-current characteristic depending on a gate voltage of a thin film transistor according to an exemplary embodiment.

Referring to FIG. 12 and FIG. 13, on and off of a source-drain current Ids depending on a gate electrode voltage Vg of the thin film transistor according to the exemplary embodiment are clearly distinguished based on a threshold voltage, and an on current is high, and thus the characteristic of the thin film transistor as a switching element may be improved. Further, the threshold voltage depending on the change of a source-drain voltage Vds is substantially unchanged, so it is seen that a uniform characteristic of the switching device may be maintained.

Figure 14:
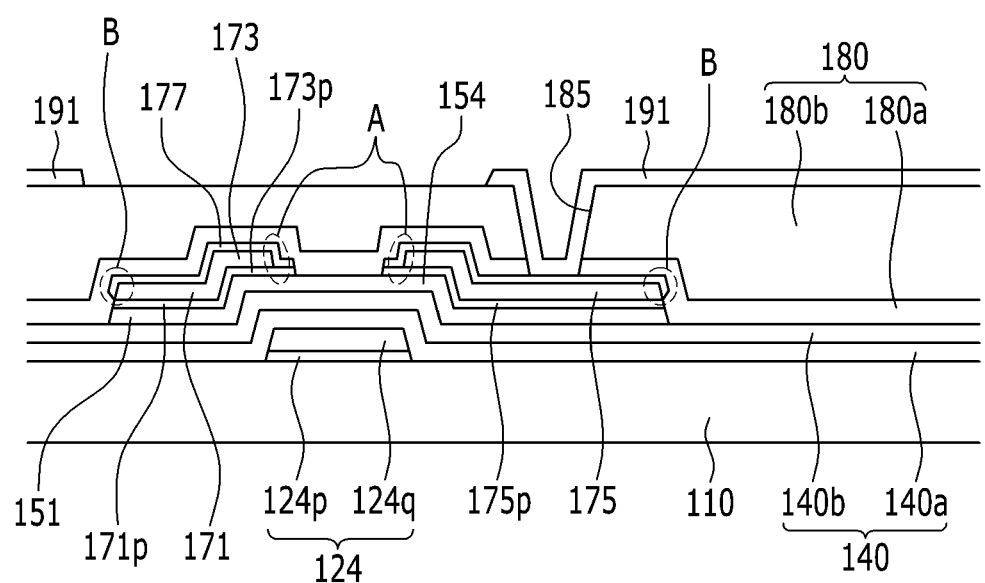
FIG. 14 is a cross-sectional view illustrating a thin film transistor array panel according to one or more exemplary embodiment of the present invention.

FIG. 14 is a cross-sectional view illustrating a thin film transistor array panel according to one or more exemplary embodiments.

The description of the exemplary embodiment illustrated in FIG. 14 is substantially identical to that of the exemplary embodiment illustrated in FIG. 2. Hereinafter, a different part from the exemplary embodiment of FIG. 2 will be described.

Referring to FIG. 14, the barrier layers 171p, 173p, and 175p may be interposed between the data wire layers 171, 173, and 175, and the semiconductor layer 151. The barrier layers 171p, 173p, and 175p may be formed of a metal oxide such as indium-zinc oxide, gallium-zinc oxide, aluminum-zinc oxide, titanium oxide, aluminum oxide, molybdenum oxide, or the like. The barrier layers 171p, 173p, and 175p serve as diffusion preventing layers preventing the material such as copper or the like from being diffused to the semiconductor layer 151.

In one or more exemplary embodiments, regions of the barrier layers 171p, 173p, and 175p exposing the channel regions of the semiconductor layer 151 may be formed to be narrower than regions of the data wire layers 171, 173, and 175 exposing the channel region of the semiconductor layer 151 by using a mask that is different from a mask for patterning the data wire layers 171, 173, and 175 when patterning the barrier layers 171p, 173p, and 175p. The barrier layers 171p, 173p, and 175p together with the metal phosphorus oxide layer 177 surround the data wire layers 171, 173, and 175. Therefore, they may prevent a metal component of the data wire layers 171, 173, and 175 from being diffused to an upper or lower layer.

According to one or more exemplary embodiments, the metal phosphorus oxide layer 177 may cover the data wire layers 171, 173, and 175. The data wire layers 171, 173, and 175 may not be oxidized. Therefore, the thin film transistor array panel having improved reliability may be provided.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A thin film transistor array panel, comprising:
   a substrate;
   a gate line on the substrate, the gate line including a gate electrode;
   a gate insulating layer on the gate electrode;
   a semiconductor layer with a channel region on the gate insulating layer, and the semiconductor layer including an oxide semiconductor;
   a data wire layer above the semiconductor layer, the data wire layer including a data line, a source electrode coupled to the data line, and a drain electrode facing the source electrode; and
   a metal phosphorus oxide layer configured to cover the source electrode and the drain electrode,
   wherein the metal phosphorus oxide layer includes phosphorus, oxygen, and at least one selected from a group consisting of a copper-based metal, an aluminum-based metal, a silver-based metal, a molybdenum-based metal, and a titanium-based metal.

2. The thin film transistor array panel of claim 1, wherein the channel region of the semiconductor layer includes phosphorus (P).

3. The thin film transistor array panel of claim 1, wherein the metal phosphorus oxide layer covers an upper surface and a lateral surface of each of the source electrode and the drain electrode.

4. The thin film transistor array panel of claim 1, further comprising a barrier layer interposed between the data wire layer and the semiconductor layer.

5. The thin film transistor array panel of claim 4, wherein each of the data wire layer and the barrier layer is configured to expose a channel region of the semiconductor layer to an upper layer.

6. The thin film transistor array panel of claim 5, wherein a region of the barrier layer exposing the channel region of the semiconductor layer is narrower than a region of the data wire layer exposing the channel region of the semiconductor layer.

7. The thin film transistor array panel of claim 1, further comprising a passivation layer configured to cover the metal phosphorus oxide layer, the source electrode, the drain electrode.

8. The thin film transistor array panel of claim 7, wherein the passivation layer includes a silicon oxide.

9. The thin film transistor array panel of claim 1, wherein lateral edge portions of the semiconductor layer, the data line, and the drain electrode and lateral portions of the source electrode and the drain electrode exposing a channel region of the semiconductor layer include lateral surfaces that are inclined at an angle of from about 10° to about 80° with respect to the substrate.

10. A method for manufacturing a thin film transistor array panel, comprising:
   forming a gate line including a gate electrode on a substrate;
   forming a semiconductor layer on the substrate;
   forming a data wire layer including a data line intersecting the gate line, a source electrode connected to the data line, and a drain electrode facing the source electrode;
   performing a phosphine treatment on the data wire layer; and
   forming a passivation layer on the data wire layer,
   wherein the forming of the passivation layer includes forming a metal phosphorus oxide layer covering the source electrode and the drain electrode.

11. The method of claim 10, wherein the performing of the phosphine treatment on the data wire layer is executed as a heat treatment or a plasma treatment.

12. The method of claim 10, wherein the metal phosphorus oxide layer is formed to cover an upper surface and a lateral surface of each of the source electrode and the drain electrode.

13. The method of claim 10, wherein the passivation layer includes a silicon oxide.

14. The method of claim 10 further comprising:
   forming a barrier layer configured to expose a channel region of the semiconductor layer after the forming of the semiconductor layer.

15. The method of claim 14, wherein a region of the barrier layer exposing the channel region of the semiconductor layer is formed to be narrower than a region of the data wire layer exposing the channel region of the semiconductor layer.

16. The method of claim 10, wherein lateral edge portions of the semiconductor layer, the data line, and the drain electrode and lateral portions of the source electrode and the drain electrode exposing a channel region of the semiconductor layer include lateral surfaces that are inclined at an angle of from about 10° to about 80° with respect to the substrate.

17. A thin film transistor array panel, comprising:
   a substrate;
   a semiconductor layer above the substrate, and the semiconductor layer including an oxide semiconductor;
   a data wire layer including a source electrode and a drain electrode, the source electrode and the drain electrode facing each other above the semiconductor layer; and
   a metal phosphorus oxide layer covering the source electrode and the drain electrode from an upper layer,
   wherein the metal phosphorus oxide layer includes phosphorus, oxygen, and at least one selected from a group consisting of a copper-based metal, an aluminum-based metal, a silver-based metal, a molybdenum-based metal, and a titanium-based metal.

18. The thin film transistor array panel of claim 17, wherein the upper layer is on both of the metal phosphorus oxide layer and the semiconductor layer.

19. The thin film transistor array panel of claim 17, further comprising:
   a first barrier layer between the semiconductor layer and the source electrode; and
   a second barrier layer between the semiconductor layer and the drain electrode,
   wherein the first barrier layer and the second barrier layer face each other, and
   wherein a distance between the first and second barrier layers on the semiconductor layer is shorter than a distance between the source electrode and the drain electrode on the semiconductor layer.

* * * * *